USO09620212B2

(12) United States Patent
Javerliac et al.

(10) Patent No.: US 9,620,212 B2
(45) Date of Patent: Apr. 11, 2017

(54) MEMORY PROVIDED WITH ASSOCIATED VOLATILE AND NON-VOLATILE MEMORY CELLS

(71) Applicants: Commissariat à l'Énergie Atomique et aux Énergies Alternatives, Paris (FR); Centre National de la Recherche Scientifique, Paris (FR)

(72) Inventors: Virgile Javerliac, Grenoble (FR); Christophe Layer, Grenoble (FR)

(73) Assignees: Commissariat à l'Énergie Atomique et aux Énergies Alternatives, Paris (FR); Centre National de la Recherche Scientifique, Paris (FR)

( * ) Notice: Subject to any disclaimer, the term of this patent is extended or adjusted under 35 U.S.C. 154(b) by 0 days.

(21) Appl. No.: 15/110,710

(22) PCT Filed: Jan. 7, 2015

(86) PCT No.: PCT/EP2015/050177
§ 371 (c)(1),
(2) Date: Jul. 8, 2016

(87) PCT Pub. No.: WO2015/104297
PCT Pub. Date: Jul. 16, 2015

(65) Prior Publication Data
US 2016/0329100 A1    Nov. 10, 2016

(30) Foreign Application Priority Data

Jan. 10, 2014    (FR) ..................................... 14 50196

(51) Int. Cl.
G11C 11/00        (2006.01)
G11C 14/00        (2006.01)
(Continued)

(52) U.S. Cl.
CPC ...... *G11C 14/0081* (2013.01); *G11C 11/1673* (2013.01); *G11C 11/1675* (2013.01); *G11C 11/419* (2013.01)

(58) Field of Classification Search
CPC .................................................. G11C 14/0081
(Continued)

(56) References Cited

U.S. PATENT DOCUMENTS 4,716,552 A       12/1987   Maltiel et al.
2006/0181916 A1    8/2006   Roehr
(Continued)

FOREIGN PATENT DOCUMENTS

EP            0297777 A2      1/1989

OTHER PUBLICATIONS

Written Opinion, dated Mar. 21, 2015, from corresponding International Application No. PCT/EP2015/050177.
(Continued)

*Primary Examiner* — Hoai V Ho
(74) *Attorney, Agent, or Firm* — Wolf, Greenfield & Sacks, P.C.

(57) ABSTRACT

A memory array including: a plurality of volatile memory cells, each including a latch; and a plurality of non-volatile memory cells, each including at least one resistive element that can be programmed by the direction of a current passed therethrough in order to take at least two resistive states, each of the non-volatile memory cells being associated with a corresponding cell from the volatile memory cells.

13 Claims, 4 Drawing Sheets

(51) Int. Cl.
*G11C 11/16* (2006.01)
*G11C 11/419* (2006.01)

(58) Field of Classification Search
USPC .................................................. 365/154, 158
See application file for complete search history.

(56) References Cited

U.S. PATENT DOCUMENTS

| | | | |
|---|---|---|---|
| 2011/0122709 A1 | 5/2011 | Kim et al. | |
| 2011/0280073 A1* | 11/2011 | Chiu .................. | G11C 13/0002 365/185.08 |
| 2013/0135918 A1 | 5/2013 | Kushida | |
| 2013/0168631 A1* | 7/2013 | Chen .................... | G11C 14/009 257/4 |
| 2014/0078810 A1 | 3/2014 | Prenat et al. | |

OTHER PUBLICATIONS

International Search Report, dated Mar. 20, 2015, from corresponding International Application No. PCT/EP2015/05077.
Haas et al.: "Magnetic Shadow RAM," (2006) American Semiconductor, Inc.; pp. 45-48.

* cited by examiner

MEMORY PROVIDED WITH ASSOCIATED VOLATILE AND NON-VOLATILE MEMORY CELLS

CROSS-REFERENCE TO RELATED APPLICATIONS

This application is the national phase of International Application No. PCT/EP2015/050177, filed on Jan. 7, 2015, which claims priority to French patent application 14/50196, filed on Jan. 10, 2014, both of which applications are hereby incorporated by reference to the maximum extent allowable by law.

FIELD

The present disclosure relates to the field of memory arrays, and in particular to a memory array combining volatile and non-volatile data storage.

BACKGROUND

It has been proposed to use programmable resistive elements in memory cells to provide non-volatile data storage. Such resistive elements are programmable to adopt one of two different resistive states. The programmed resistive state is maintained even when a supply voltage of the memory cell is disconnected, and thus data can be stored by such elements in a non-volatile fashion.

Various types of resistive elements have been proposed, some of which are capable of being programmed by the direction of a current that is passed through the resistive element.

An example of such a current-programmable resistive element is an STT (spin transfer torque) element, which is based on magnetic tunnelling junctions (MTJs).

A difficulty with the use of resistive elements for data storage is that read and write operations tend to be relatively slow, leading to a high access time with respect to a standard volatile memory such as an SRAM (static random access memory). To overcome this difficulty, it has been proposed to provide, in each memory cell, circuitry for programming the state of the resistive element and for reading, amplifying and storing a programmed resistive state. However, while such a solution leads to an improvement in access times, the surface area used by each memory cell, and the power consumption, tend to be high.

There is thus a need in the art for a non-volatile memory array having relatively low access times and/or a reduced surface area with respect to existing non-volatile memories.

SUMMARY

It is an aim of embodiments of the present description to at least partially address one or more needs in the prior art.

According to one aspect, there is provided a memory array comprising: a plurality of volatile memory cells each comprising a latch; and a plurality of non-volatile memory cells each comprising at least one resistive element programmable by the direction of current passed through it to have one of at least two resistive states, wherein each of the non-volatile memory cells is associated with a corresponding one of said non-volatile memory cells.

According to one embodiment, the memory array further comprises a read/write circuit having a comparator adapted to read a first data bit stored by a first of the volatile memory cells and to read a second data bit stored by a second of the non-volatile memory cells.

According to one embodiment, the read/write circuit is coupled to each of the volatile and non-volatile memory cells via one or more pairs of bit lines.

According to one embodiment, the read/write circuit is adapted to perform at least one of: read a first data bit stored by a first of the volatile memory cells and program, based on the first data bit, the resistive state of a first of the non-volatile memory cells associated with the first volatile memory cell; and read from a second of the non-volatile memory cells a programmed resistive state representing a second data bit and write the second data bit to a second of the volatile memory cells associated with the second non-volatile memory cell.

According to one embodiment, the comparator has first and second inputs, and wherein the read/write circuit further comprises: at least one multiplexer adapted to couple the first and second inputs of the comparator to complementary storage nodes of the first volatile memory cell to read the first data bit, and to couple the first and second inputs of the comparator to outputs of an amplifier adapted to detect the programmed resistive state of the second non-volatile memory cell.

According to one embodiment, the read/write circuit further comprises: a write circuit adapted to write a data bit to a first of the volatile memory cells by applying a voltage across complementary storage nodes of the first volatile memory cell and to program a resistive state of a first of the non-volatile memory cells by passing a current through the resistive element of the first non-volatile memory cell.

According to one embodiment, the memory array further comprises a plurality of selection lines, and each of the volatile memory cells and its associated non-volatile memory cell are coupled to a same selection line of the memory array.

According to one embodiment, each of the volatile memory cells and its associated non-volatile memory cell are each coupled to a same pair of bit lines.

According to one embodiment, the volatile memory cells are each coupled to a first pair of bit lines and the non-volatile memory cells are each coupled to a second pair of bit lines.

According to one embodiment, each of the volatile memory cells is coupled to a voltage supply rail coupled via a switch to a supply voltage level.

According to one embodiment, the non-volatile memory cells each comprise a single resistive element coupled in series with a first transistor between a pair of bit lines.

According to one embodiment, the non-volatile memory cells each comprise: a first resistive element coupled in series with a first transistor between a first bit line and a first supply voltage; and a second resistive element coupled in series with a second transistor between a second bit line and the first supply voltage.

According to one embodiment, the at least one resistive element of each of the non-volatile memory cells is one of: a spin transfer torque element with in-plane anisotropy; a spin transfer torque element with perpendicular-to-plane anisotropy; and a reduction oxide element.

According to a further aspect, there is provided a method of data back-up in the above memory array, the method comprising: reading a first data bit stored by a first of the volatile memory cells; and programming the resistive state of a first of the non-volatile memory cells associated with the first volatile memory cell based on the first data bit.

According to a further aspect, there is provided a method of restoring data in the above memory array, the method comprising: reading from a second of the non-volatile memory cells a programmed resistive state representing a second data bit; and writing the second data bit to a second of the volatile memory cells associated with the second non-volatile memory cell.

BRIEF DESCRIPTION OF THE DRAWINGS

The foregoing and other features and advantages will become apparent from the following detailed description of embodiments, given by way of illustration and not limitation with reference to the accompanying drawings, in which.

DETAILED DESCRIPTION

Throughout the following description, the term "connected" is used to refer to a direct connection between one element and another, while the term "coupled" implies that the connection between the two elements may be direct, or via an intermediate element, such as a transistor, resistor or other component.

Figure 1:
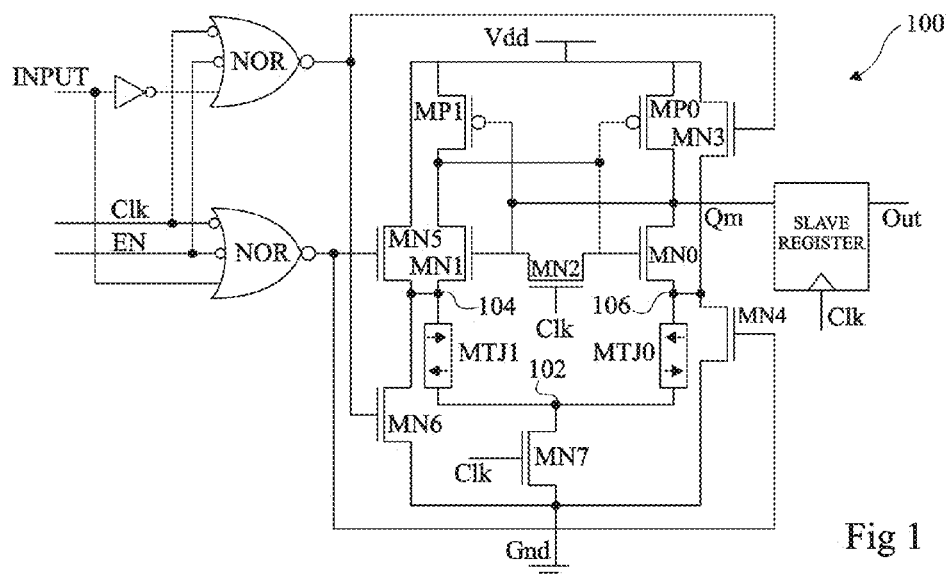
FIG. 1 schematically illustrates an example of a non-volatile flip-flop.

FIG. 1 substantially reproduces FIG. 7 of the publication entitled "Spin-MTJ based Non-Volatile Flip-Flop", Weisheng Zhao et al., Proceedings of the 7th IEEE International Conference on Nanotechnology, Aug. 2-5, 2007, Hong-Kong.

The flip-flop 100 represented in FIG. 1 comprises a master register and a slave register (SLAVE REGISTER). The master register comprises magnetic tunnel junction devices MTJ1 and MTJ0, programmable by the direction of a current passed through them. Device MTJ1 is connected between an intermediate node 104 and an interconnection node 102. Device MTJ0 is connected between an intermediate node 106 and the interconnection node 102. The interconnection node 102 connects together the MTJ devices MTJ0 and MTJ1. The intermediate node 104 is further coupled to a supply voltage Vdd via a pair of transistors MN1 and MP1 coupled in series and forming a first inverter. The intermediate node 106 is further coupled to the supply voltage Vdd via a pair of transistors MP0 and MN0 coupled in series and forming a second inverter. The first and second inverters are cross-coupled with each other, and the output of the second inverter is connected to the slave register. A transistor MN2 is coupled between the gate nodes of transistors MN1 and MN0.

A transistor MN5 is coupled between the intermediate node 104 and the supply voltage Vdd, and a transistor MN6 is coupled between the intermediate node 104 and ground. Furthermore, a transistor MN3 is coupled between the intermediate node 106 and the supply voltage Vdd, and a transistor MN4 is coupled between the intermediate node 106 and ground. A transistor MN7 is coupled between the intermediate node 102 and ground. The transistors MN3 to MN6 permit a current to be passed through the resistive elements MTJ1 and MTJ0 in one direction or the other in order to program the resistive states of the MJT devices. During this programming phase, the transistor MN7 is used to disconnect the node 102 from ground. A pair of NOR gates and an inverter on the left-hand side of FIG. 1, which are controlled by an input signal INPUT, a clock signal Clk and an enable signal EN, generate signals for controlling the transistors MN3 to MN6. When the transistor MN7 is activated, the transistors MP0, MP1, MN0 and MN1 form a sense amplifier for reading the states of the elements MTJ0 and MTJ1.

The memory cell forming the master register of FIG. 1 is not suitable for use in a memory array in view of its relatively high number of transistors. Furthermore, the transistors forming the sense amplifier are relatively large, because they must be able to conduct sufficient current to permit the resistive states of the elements MTJ0 and MTJ1 to be detected.

Figure 2:
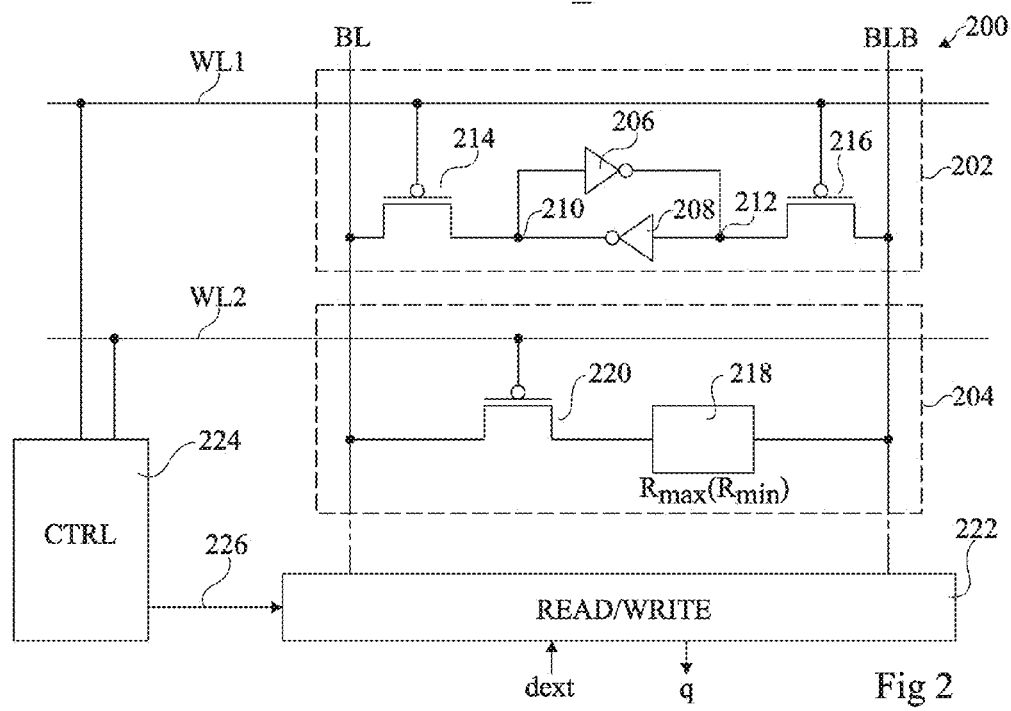
FIG. 2 schematically illustrates part of a non-volatile/volatile memory array according to an example embodiment.

FIG. 2 schematically illustrates circuitry 200 associated with one column of a combined non-volatile/volatile memory array according to an example embodiment of the present disclosure.

The circuitry 200 comprises a volatile memory cell 202, and a non-volatile memory cell 204 associated with the volatile memory cell 202. As it will become apparent hereafter, the volatile and non-volatile memory cells are associated with each other in that, at least some of the time, the non-volatile memory cell stores a back-up of a data bit held by the volatile memory cell, and may be used to restore this data bit to the volatile memory cell. In the example of FIG. 2, the memory cells 202, 204 are coupled between a same pair of bit lines BL, BLB.

While FIG. 2 illustrates a single volatile memory cell and a single non-volatile cell, the column may comprise any number of volatile cells and associated non-volatile cells coupled between the bit lines BL and BLB. Furthermore, while a single column is illustrated in FIG. 2, the memory array may comprise any number of columns of the type shown in FIG. 2, each with a corresponding read/write circuit.

The volatile memory cell 202 is for example an SRAM (static random access memory) cell, comprising a latch formed of a pair of inverters 206, 208 cross-coupled between storage nodes 210, 212. A transistor 214, which is for example a PMOS transistor, couples the storage node 210 to the bit line BL. A transistor 216, which is also for example a PMOS transistor, couples the storage node 212 to the bit line BLB. The transistors 214 and 216 are for example controlled by a row selection line WL1 of the memory array.

The non-volatile memory cell 204 for example comprises a programmable resistive element 218 coupled in series with a transistor 220, which is for example a PMOS transistor, between the bit lines BL and BL1. The transistor 220 is for example controlled by a row selection line WL2 of the memory array.

The resistive element 218 is for example any type of resistance switching element for which the resistance is programmable by the direction of a current passed through it. The resistive element 218 is for example an STT (spin-torque-transfer) element with in-plane or perpendicular-to-plane anisotropy, as described in more detail in the publication entitled "Magnonic spin-transfer torque MRAM with low power, high speed, and error-free switching", N. Mojumder et al., IEDM Tech. Digest (2010), and in the publication entitled "Electric toggling of magnets", E. Tsymbal, Natural Materials Vol 11, January 2012. Alternatively, the resistive elements could be those used in RedOx RAM (reduction oxide RAM) resistive switching memories, which are for example described in more detail in the publication entitled "Redox-Based Resistive Switching Memories—Nanoionic Mechanisms, Prospects and Challenges", Rainer Waser et al., Advanced Materials 2009, 21, pages 2632 to 2663.

Whatever the type of resistive element, a bit of data is for example stored in a non-volatile manner by programming the element to have either a relative high resistance (Rmax) or a relatively low resistance (Rmin). The resistive element 218 for example has just two resistive states corresponding to the high and low resistances Rmax and Rmin, but the exact values of Rmin and Rmax may vary depending on conditions such as process, materials, temperature variations etc. The resistive element 218 is for example selected such that Rmax is always significantly greater than Rmin, for example at least 20 percent greater. In general, the ratio between the resistance Rmax and the resistance Rmin is for example between 1.2 and 10000. Rmin is for example in the region of 2 k ohms or less, and Rmax is for example in the region of 6 k ohms or more, although many other values are possible The bit lines BL and BLB are coupled to a read/write circuit (READ/WRITE) 222. A control circuit 224 provides control signals on a line 226 to the read/write circuit 222, and to the selection lines WL1 and WL2. The read/write circuit 222 is capable of reading a bit of data from the volatile memory cell 202, for example by pre-charging the bit lines BL and BLB with a high voltage, and detecting a voltage drop on one or the other of the bits when the signal WL1 is asserted by the control circuit 224. The read/write circuit 222 is also capable of reading a bit of data from the non-volatile memory cell 204, for example by applying a voltage across the bit lines BL, BLB while the signal WL2 is asserted by the control circuit 224, in order to generate a current through the resistive element 218. The level of this current is for example compared to a reference current in order to determine the programmed resistive state of the element 218. The data read from the non-volatile memory cell 202 or volatile memory cell 204 can be supplied as a signal q at an output of the read/write circuit 222, and/or written to one of the volatile or non-volatile memory cells during a back-up or restoration phase, as will be explained in more detail.

The read/write circuit 222 is capable of writing a bit of data to the non-volatile memory cell 204 via the bit lines BL and BLB. This data may be external data dext provided to the read/write circuit 222 from an external circuit, or internal data read from one of the other memory cells, for example the volatile memory cell 202. For example, during a data back-up phase, a bit of data is read by the read/write circuit 222 from the volatile memory cell 202, and written to the non-volatile memory cell 204. The write operation involves applying by the read/write circuit 222 a high voltage to the bit line BL and a low voltage to the bit line BLB, or vice versa, depending on the data to be written. The control circuit 224 then asserts the signal WL2 to activate the transistor 220, such that a write current flows in one direct or the other through the resistive element 218 to program its state.

The read/write circuit 222 is also capable of writing a bit of data to the volatile memory cell 202 via the bit lines BL and BLB. Again, this data may be external data dext provided to the read/write circuit 222, or internal data read from one of the other memory cells, for example the non-volatile memory cell 202. For example, during a restore phase, a bit of data is read by the read/write circuit 222 from the non-volatile memory cell 204, and written to the volatile memory cell 202. The write operation involves applying by the read/write circuit 222 a high voltage to the bit line BL and a low voltage to the bit line BLB, or vice versa, depending on the data to be written. The control circuit 224 then asserts the signal WL1, for example to a low level, to activate the transistors 214, 216, such that the latch formed by the inverters 206, 208 is programmed based on the voltages on the bit lines BL, BLB.

While FIG. 2 shows one example of the circuits forming the volatile and non-volatile memory cells 202, 204, it will be apparent to those skilled in the art that in alternative embodiments, different circuits could be used.

Figure 3:
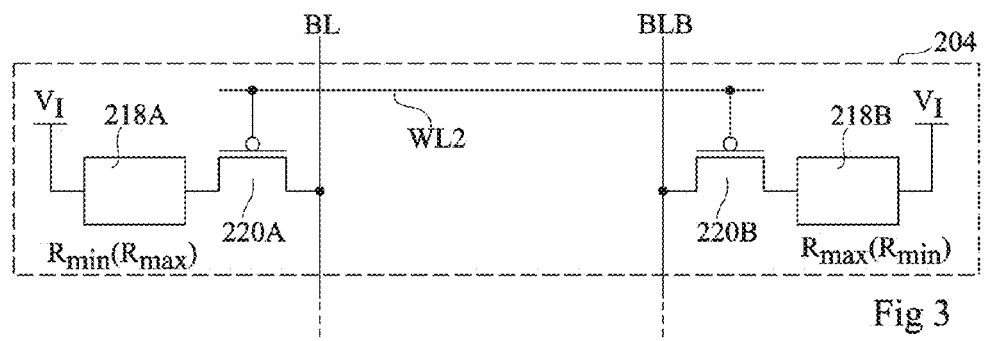
FIG. 3 schematically illustrates a non-volatile memory cell according to an example embodiment.

FIG. 3 illustrates the non-volatile memory cell 204 according to an alternative embodiment to the one shown in FIG. 2. In particular, rather than comprising a single resistive element 218, the circuit of FIG. 3 comprises a pair of resistive elements 218A, 218B. The element 218A is coupled in series with a transistor 220A, which is for example a PMOS transistor, between the bit line BL and an intermediate supply voltage VI. Similarly, the element 218B is coupled in series with a transistor 220B, which is for example a PMOS transistor, between the bit line BLB and the intermediate supply voltage VI. For example, the resistive elements 218A, 218B each have one of their nodes coupled to the voltage VI, and their other node coupled to the corresponding bit line. As will be described in more detail below, the intermediate supply voltage VI is for example at or close to half the value of supply voltage VDD. The transistors 220A, 220B are for example controlled by the selection line WL2.

The non-volatile data bit represented by the resistive elements 218A, 218B depends on which of the resistive elements is at the resistance Rmax and Rmin, in other words on the relative resistances. The values of Rmax and Rmin are for example the same as for the resistive element 218 of FIG. 2 described above. In FIG. 3, the resistive element 218A is shown programmed to have a resistance Rmin and the element 218B a resistance Rmax, and as shown by the references Rmax and Rmin in brackets, the opposite programming of the resistance values would be possible.

In operation, the read/write circuit 222 of FIG. 2 writes to the non-volatile memory cell 204 of FIG. 3 in the same way as described above in relation to FIG. 2, by applying a high voltage to one of the bit lines and a low voltage to the other bit line, and asserting the signal WL2 to cause a current to flow through each of the resistive elements 218A, 218B. The high voltage for example being at a VDD level of between 2 and 3 V, and the intermediate voltage being at around VDD/2, for example between 1 and 1.5 V, a current will flow through each of the resistive elements 218A, 218B in a different direction depending on the voltage applied to the corresponding bit line.

The read/write circuit 222 reads the relative resistive state of the resistive elements 218A, 218B by applying a voltage, for example at the supply voltage VDD or ground, to each of the bit lines BL, BLB, while the signal WL2 is asserted, and then comparing, using a comparator, the current level flowing to or from each bit line.

Figure 4:
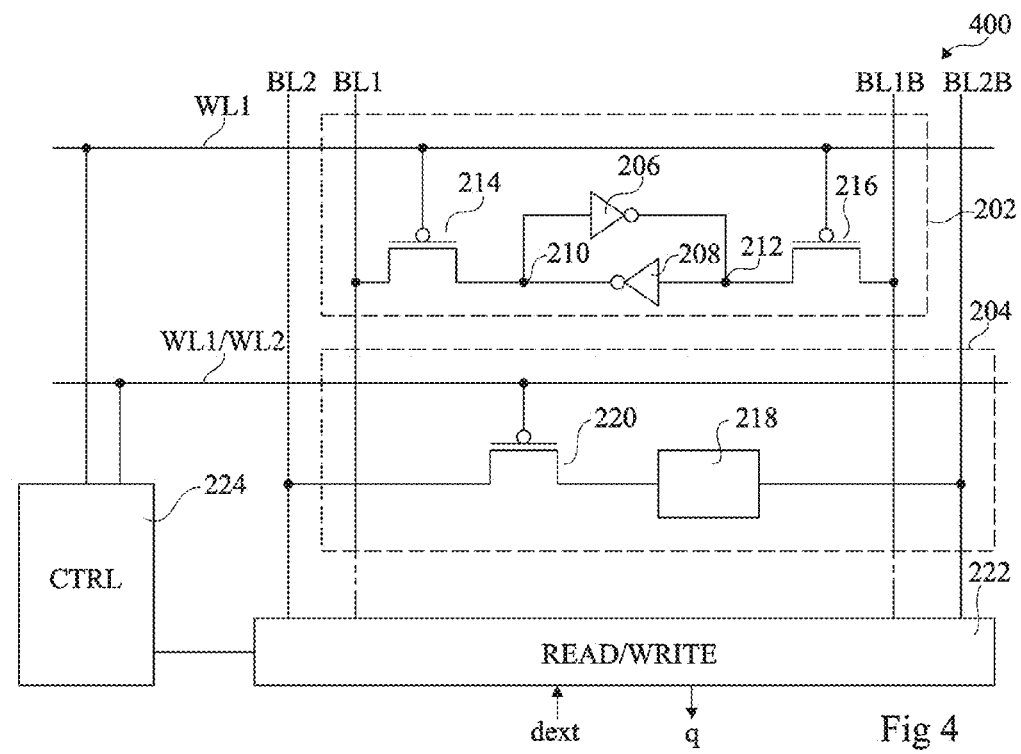
FIG. 4 schematically illustrates part of a non-volatile/volatile memory according to a further example embodiment.

FIG. 4 schematically illustrates circuitry 400 associated with one column of a non-volatile/volatile memory array according to a further example embodiment of the present disclosure. The circuitry 400 is very similar to that of FIG. 2, and like features are labelled with like reference numerals and will not be described again in detail. However, in the FIG. 4, the volatile memory cell 202 is coupled between a first pair of bit lines BL1, BL1B, and the non-volatile memory cell 204 is coupled between a second pair of bit lines BL2, BLB2. Thus the read/write circuit 222 accesses data stored by the volatile memory cell 202 via the bit lines BL1, BL1B, and data stored by the non-volatile memory cell 204 via the bit lines BL2 BL2B.

The transistors 214, 216 of the volatile memory cell are controlled by the selection line WL1, and the transistor 220 of the non-volatile memory cell 204 may be controlled by a different selection line WL2 like in the circuit of FIG. 2, or by the same selection line WL1 as the memory cell 202. In the latter case, the back-up or restore operation described above between the memory cells 202, 204 may be performed by asserting only the control signal WL1.

While not shown in FIG. 4, there may be further non-volatile memory cells coupled between the bit lines BL1, BL1B and further associated non-volatile memory cells coupled between the bit lines BL2, BLB2. Furthermore, the non-volatile memory cell 204 of FIG. 4 could alternatively be implemented by the circuit of FIG. 3, the transistors 220A, 220B being coupled to the bit lines BL2, BL2B.

FIGS. 5A to 5F schematically represent arrangements of volatile and non-volatile memory cells in memory arrays 502 according to example embodiments of the present disclosure. In these figures, empty squares represent volatile memory cells 202, and diagonally striped squares represent non-volatile memory cells 204. Row control circuitry 504 generates the control signals for controlling the selection lines WL1, WL2 of the memory cells of the array, and a read/write block 506 reads and writes to the memory cells of the array. For ease of illustration, FIG. 5A to 5F illustrate memory arrays 502 comprising just 32 volatile memory cells 202 and 32 non-volatile memory cells 204. In alternative embodiments, there could be any number of volatile and non-volatile memory cells.

Figures 5A, 5B, 5C:
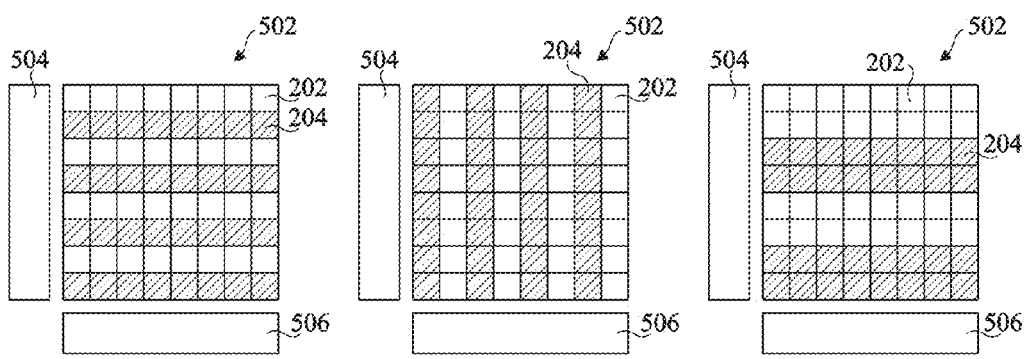
FIGS. 5A to 5F schematically illustrate non-volatile/volatile memory arrays according to example embodiments.

In FIG. 5A, the memory array 502 comprises alternate rows of volatile memory cells 202 and non-volatile memory cells 204. Each volatile memory cell 202 is for example vertically adjacent to its associated non-volatile memory cell 204. In each column, the memory cells share a common pair of bit lines, like in the embodiment of FIG. 2.

In FIG. 5B, the memory array 502 comprises alternate columns of volatile memory cells 202 and non-volatile memory cells 204. Each volatile memory cell 202 is for example horizontally adjacent to its associated non-volatile memory cell 204. Thus the volatile and non-volatile memory cells do not share pairs of bit lines, this embodiment being like the one of FIG. 4. Also like the embodiment of FIG. 4, the volatile and non-volatile memory cells 202, 204 in each row may or may not share a common row selection line.

In FIG. 5C, the memory array 502 is similar to the one of FIG. 5A, comprising rows of volatile memory cells 202, and rows of non-volatile memory cells 204. However, rather than there being alternate rows of volatile and non-volatile memory cells, rows of volatile memory cells 202 are grouped together, and rows of non-volatile memory cells 204 are grouped together, each group having two rows in the example of FIG. 5C. Thus each volatile memory cell 202 is no longer adjacent to its associated non-volatile memory cell 204.

Figures 5D, 5E, 5F:
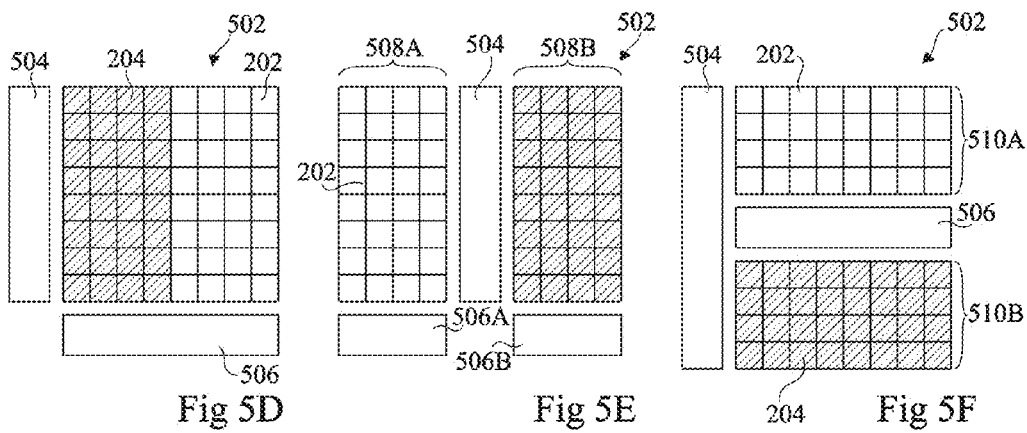

In FIG. 5D, the memory array 502 is similar to the one of FIG. 5B, comprising columns of volatile memory cells 202, and columns of non-volatile memory cells 204. However, rather than there being alternate columns of volatile and non-volatile memory cells, columns of volatile memory cells 202 are grouped together, and columns of non-volatile memory cells 204 are grouped together, each group having four columns in the example of FIG. 5D. Thus again each volatile memory cell 202 is no longer adjacent to its associated non-volatile memory cell 204.

In FIG. 5E, the memory array 502 is similar to the array of FIG. 5D, except that the columns of volatile memory cells 202 form one bank 508A of memory cells, and the columns of non-volatile cells 204 form another bank 508B of memory cells. The banks 508A, 508B are for example physically separated by the row control circuitry 504, and each row of volatile memory cells 202 in bank 508A may or may not share a common row selection line with a corresponding row of non-volatile memory cells 204 in the bank 508B. Each bank 508A, 508B is for example associated with a corresponding read/write block 506A, 506B.

In FIG. 5F, the memory array 502 is similar to the array of FIG. 5C, except that the rows of volatile memory cells 202 form one bank 510A of memory cells, and the rows of non-volatile cells 204 form another bank 510B of memory cells. The banks 510A, 510B are for example physically separated by the read/write block 506. For example, the columns of volatile memory cells 202 of bank 510A do not share common bit lines with the columns of non-volatile memory cells 204 of bank 510B.

Figure 6:
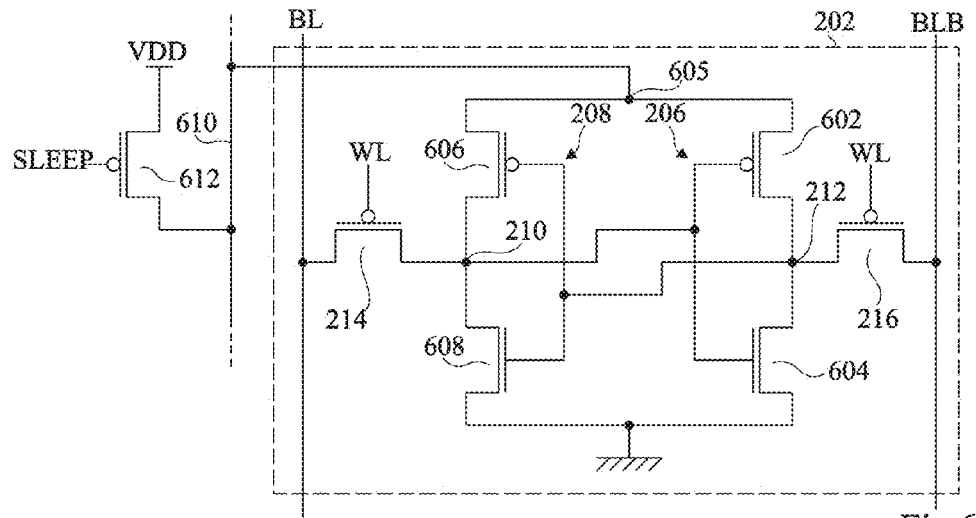
FIG. 6 schematically illustrates a volatile memory cell in more detail according to an example embodiment.

FIG. 6 illustrates the volatile memory cells 202 in more detail according to an example embodiment. The inverter 206 is for example formed by a PMOS transistor 602 and an NMOS transistor 604 coupled in series between a supply node 605 and ground. The control nodes of transistors 602, 604 are coupled to the storage node 210, and an intermediate node between these transistors forms the storage node 212. Similarly, the inverter 208 is for example formed by a PMOS transistor 606 and an NMOS transistor 608 coupled in series between the supply node 605 and ground. The control nodes of transistors 606, 608 are coupled to the storage node 212, and an intermediate node between these transistors forms the storage node 210.

The supply node 605 is for example coupled to a voltage supply rail 610, which is in turn coupled to a supply voltage VDD via a PMOS transistor 612 controlled by a sleep signal SLEEP. The supply rail 610 for example supplies all of the volatile memory cells of the column, and thus by deactivating the transistor 612, the volatile memory cells can be powered down to conserve energy. In particular, prior to entering a sleep mode, the data from each of the volatile memory cells 202 is for example backed-up to its associated non-volatile memory cell 204, and then the volatile memory cells are powered down by deactivating the transistor 612. At the end of the sleep period, the transistor 612 is for example activated to power-up the volatile memory cells 202, and the data stored by each non-volatile memory cells 204 is for example restored to its associated volatile memory cell.

Figure 7A:
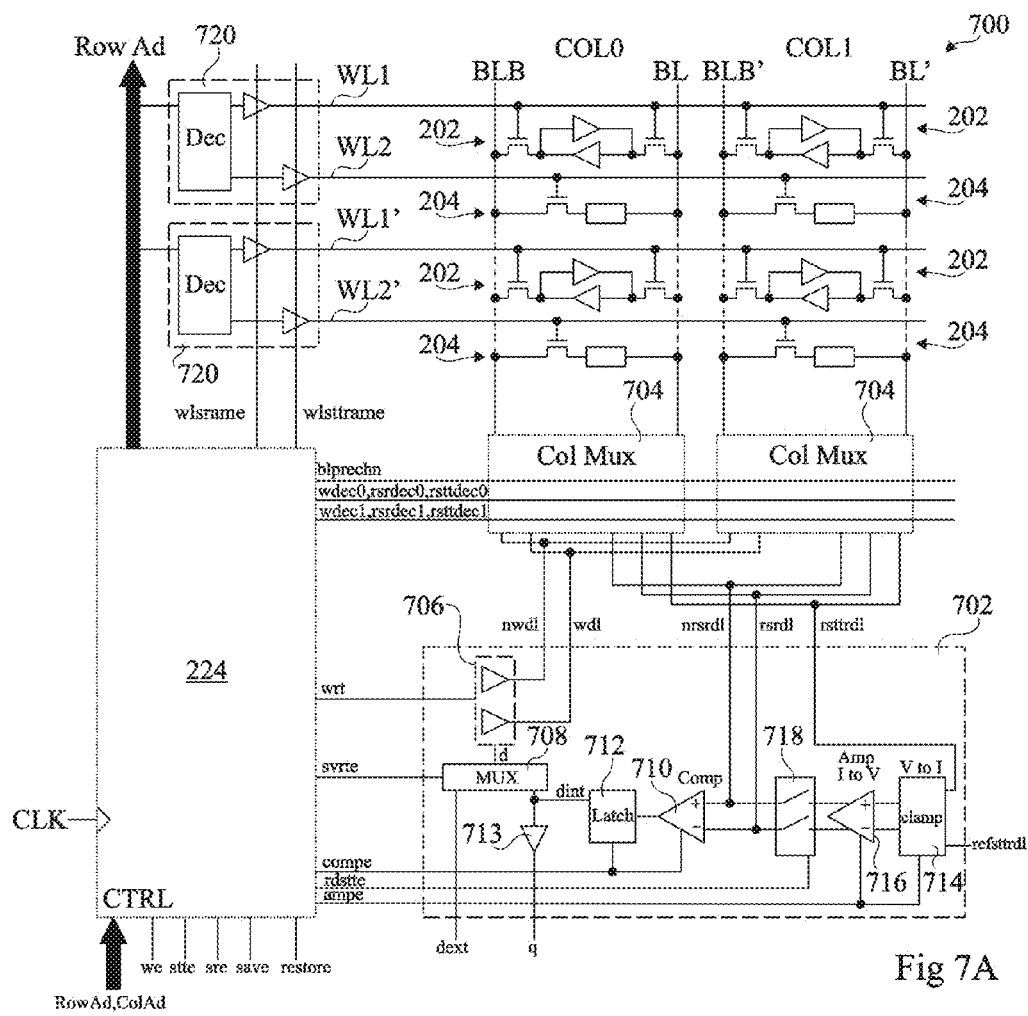
FIG. 7A schematically illustrates a non-volatile/volatile memory array according to an example embodiment of the present disclosure.

FIG. 7A schematically illustrates a memory device comprising the circuitry 200 of FIG. 2 according to an example embodiment. It will be apparent to those skilled in the art how this device could be adapted to operate based on the memory cells of FIG. 3 or 4.

Two columns COL0 and COL1 are illustrated in FIG. 7, and two volatile memory cells 202 and two non-volatile memory cells 204 are illustrated in each column, although in alternative embodiments there could be any number of columns and any number of memory cells in each column.

The read/write circuit comprises a read/write module 702, and a column multiplexer (Col Mux) 704 associated with each column. Thus in the embodiment of FIG. 7A, the read/write module 702 is associated with more than one column of the memory array. In alternative embodiments, a separate read/write module 702 could be provided for each column of the array.

Figure 7B:
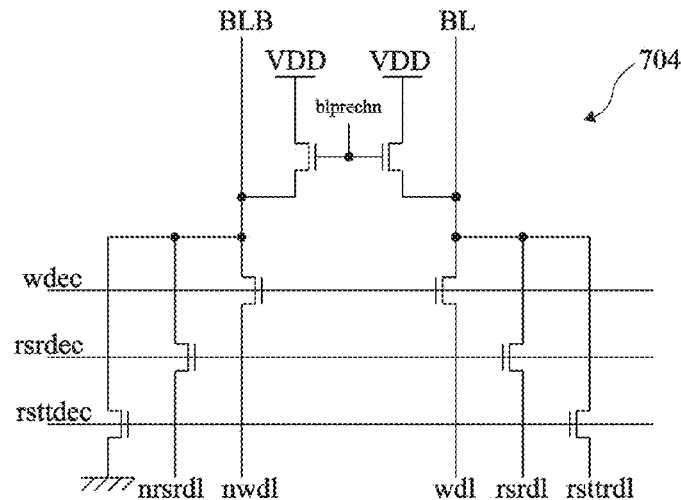
FIG. 7B schematically illustrates a column multiplexer of the memory array of FIG. 7A in more detail according to an example embodiment.

FIG. 7B illustrates one of the column multiplexers 704 in more detail according to an example embodiment. With reference to both FIGS. 7A and 7B, the column multiplexer 704 of column COL0 selectively couples the bit lines BL, BLB respectively to:

complementary write lines wdl and nwdl when a write signal wdec0 of column COL0 is asserted;

to a supply voltage VDD to precharge the bit lines before a volatile cell is to be read when a precharge signal blprechn is asserted;

to complementary volatile cell read lines rsrdl, nrsrdl when a volatile read signal rsrdec0 of column COL0 is asserted; and to a non-volatile read line rsttrdl and a read voltage level, for example at ground, when a non-volatile read signal rsttdec0 is asserted.

The column multiplexer 704 for example comprises:

two PMOS transistors controlled by the signal blprechn for respectively coupling the bit lines BL and BLB to the supply voltage VDD;

two NMOS transistors controlled by the signal wdec for respectively coupling the bit lines BL and BLB to the write lines wdl and nwdl;

two NMOS transistors controlled by the signal rsrdec for respectively coupling the bit lines BL and BLB to the volatile read lines rsrdl and nrsrdl; and two NMOS transistors controlled by the signal rsttdec for respectively coupling the bit lines BL and BLB to the non-volatile read line rsttrdl and ground.

Referring again to FIG. 7A, the read/write module 702 comprises a write circuit 706, which generates voltages to be applied to the bit lines of a selected column based on a write signal wrt from the control block 224, and a data signal d from a data multiplexer 708. The data multiplexer 708 selects either external data dext received from outside the memory array, or internal data dint read from a memory cell of the array, based on a save/restore signal svrte.

The read/write module 702 also comprises a comparator (Comp) 710, having positive and negative inputs respectively coupled to the volatile cell read lines nrsrdl and rsrdl. An output of the comparator 710 is coupled to a data latch (Latch) 712, which in turn provides the internal data signal dint. The comparator 710 and latch 712 each receive a timing signal compe. The internal data signal dint is provided via an output buffer 713 as the output data signal q of the read/write module 702.

The non-volatile cell read line rsttrdl is coupled to a voltage clamping circuit (clamp) 714, which applies a voltage level to the line rsttrdl in order to generate a current through the resistive element of a selected non-volatile memory cell 204. Similarly, the voltage clamping circuit 714 also for example applies a voltage to a reference line refsttrdl coupled to a reference device (not illustrated) such that a reference current is generated. The reference device for example has a resistance equal to (Rmax+Rmin)/2, such that the reference current provides a cut-off level for determining whether the resistive element has a programmed resistance of Rmin or Rmax. The currents generated by the voltage clamping circuit 714 are converted into voltage levels and amplified by an amplifier 716. The voltage clamping circuit 714 and amplifier 716 for example receive a timing signal ampe.

The amplifier 716 provides differential voltage outputs, which are in turn coupled via switches 718 to the inputs of the comparator 710. The switches 718 are controlled by a non-volatile read control signal rdstte from the control block 224.

A row decoder 720 is for example associated with each pair of volatile/non-volatile rows of the memory array. Row decoder 720 receives a row address, and when the address corresponds to the address of the row, asserts the corresponding row control signal WL1 when a volatile row selection signal wlsrame is asserted, or asserts the corresponding row control signal WL2 when a non-volatile row selection signal wlsttrame is asserted.

The control block 224 receive a clock signal clk, a row address signal Row Ad, a column address signal Col Ad, a write enable signal we, a non-volatile cell selection signal stte, a volatile cell selection signal sre, a save signal save, and a restore signal restore.

Operation of the memory 700 will now be described with reference to FIG. 8.

Figure 8:
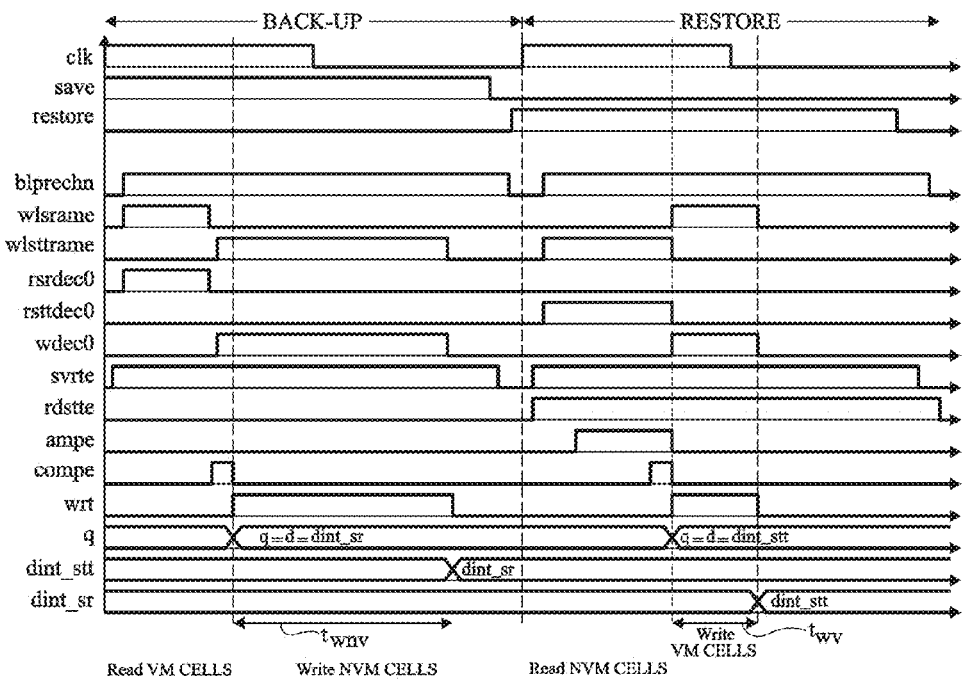
FIG. 8 is a timing diagram showing examples of signals in the memory array of FIG. 7A according to an example embodiment.

FIG. 8 is a timing diagram illustrating examples of the signals clk, save, restore, blprechn, wlsrame, wlsttrame, rsrdec0, rsttdec0, wdec0, svrte, rdstte, ampe, compe, wrt, q, dint_stt and dint_sr, in the memory array 700 of FIG. 7A during a back-up and a restore operation between the volatile and non-volatile memory cells of column COL0 of FIG. 7A. The signal dint_stt corresponds to the data stored by the non-volatile memory cell 204 and the signal dint_sr corresponds to the data stored by the volatile memory cell 202. During the back-up and restore operations, the signal svrte is high, such that the data written to the memory cells is the internal data dint that has been read from the memory cells.

The back-up operation is triggered by a high value of the signal save, and starts with a read operation of the data dint_sr stored by the volatile memory cell. The signal blprechn is initially low to precharge the bit lines BL and BLB. The signal blprechn then goes high, the signal wlsrame goes high to assert the signal WL1 and select the volatile memory cell, and rsrdec0 goes high to couple the bit lines of the column COL0 to the inputs of the comparator 710. The timing signal compe then goes high to store the data signal to the latch 712. On the falling edge of the signal compe, the q signal transitions to the volatile cell data signal dint_sr.

The back-up operation then involves a write operation to the non-volatile cell. Thus the signals wlsttrame and wdec0 are high, and the write signal wrt then goes high. After a write time twnv, the write signal wrt goes low, and the data dint_stt stored by the non-volatile memory cell becomes equal to the volatile data dint_sr.

The restore operation is triggered by a high value of the restore signal, and starts with a read operation of the data dint_stt stored by the non-volatile memory cell. The signal wlsttrame thus goes high to assert the signal WL2 and select the non-volatile memory cell, and rsttdec0 goes high to couple the bit lines to ground and to the read data line rsttrdl. The timing signal ampe then goes high to activate the voltage clamp 714 and the amplifier 716, and the timing signal compe then goes high to store the data signal to the latch 712. On the falling edge of the signal compe, the q signal transitions to the non-volatile cell data signal dint_stt.

The restore operation then involves a write operation to the volatile cell. Thus the signals wlsrame and wdec0 are high, and the write signal wrt also goes high. After a write time twv, which is for example shorter than the write time twnv of the non-volatile cell, the write signal wrt goes low, and the data dint_sr stored by the non-volatile memory cell becomes equal to the non-volatile data dint_stt.

An advantage of the embodiments described herein is that, by providing in a same memory array volatile memory cells, and non-volatile memory cells associated with the volatile cells, the volatile cells provide fast access times, and the memory array can have a relatively low surface area. In particular, a common read and/or write circuit can be provided for the volatile and non-volatile memory cells, and thus each memory cell can be implemented with relatively few transistors and no sense amplifier.

Having thus described at least one illustrative embodiment, various alterations, modifications and improvements will readily occur to those skilled in the art.

For example, it will be apparent to those skilled in the art that the supply voltage VDD in the various embodiments could be at any level, for example between 1 and 3 V, and rather that being at 0 V, the ground voltage can also be considered as a supply voltage that could be at any level, such as a negative level.

Furthermore, it will be apparent to those skilled in the art that, in any of the embodiments described herein, all of the NMOS transistors could be replaced by PMOS transistors and/or all of the PMOS transistors could be replaced by NMOS transistors. It will be apparent to those skilled in the art how any of the circuits could be implemented using only PMOS or only NMOS transistors. Furthermore, while transistors based on MOS technology are described throughout, in alternative embodiments other transistor technologies could be used, such as bipolar technology.

Furthermore, it will be apparent to those skilled in the art that the various features described in relation to the various embodiments could be combined, in alternative embodiments, in any combination.

The invention claimed is:

1. A memory array comprising:
a plurality of volatile memory cells each comprising a latch;
a plurality of non-volatile memory cells each comprising at least one resistive element programmable by the direction of current passed through it to have one of at least two resistive states, wherein each of the non-volatile memory cells is associated with a corresponding one of said volatile memory cells; and
a read/write circuit coupled to each of the volatile and non-volatile memory cells via one or more pairs of bit lines, the read/write circuit having a comparator adapted to read a first data bit stored by a first of the volatile memory cells and to read a second data bit stored by a second of the non-volatile memory cells.

2. The memory array of claim 1, wherein said read/write circuit is adapted to perform at least one of:
read the first data bit stored by a first of said volatile memory cells and program, based on said first data bit, the resistive state of a first of said non-volatile memory cells, associated with said first volatile memory cell; and read, from a second of said non-volatile memory cells, a programmed resistive state representing the second data bit and write said second data bit to a second of said volatile memory cells associated with said second non-volatile memory cell.

3. The memory array of claim 1, wherein said comparator has first and second inputs, and wherein said read/write circuit further comprises:
at least one multiplexer adapted to couple the first and second inputs of the comparator to complementary storage nodes of said first volatile memory cell to read said first data bit, and to couple the first and second inputs of the comparator to outputs of an amplifier adapted to detect the programmed resistive state of said second non-volatile memory cell.

4. The memory array of claim 1, wherein said read/write circuit further comprises:
a write circuit adapted to write a data bit to a first of said volatile memory cells by applying a voltage across complementary storage nodes of said first volatile memory cell and to program a resistive state of a first of said non-volatile memory cells by passing a current through the resistive element of the first non-volatile memory cell.

5. The memory array of claim 1, further comprising a plurality of selection lines, and wherein:
each of said volatile memory cells and its associated non-volatile memory cell are coupled to a same selection line of said memory array.

6. The memory array of claim 1, wherein each of said volatile memory cells and its associated non-volatile memory cell are each coupled to a same pair of bit lines.

7. The memory array of claim 1, wherein said volatile memory cells are each coupled to a first pair of bit lines and wherein said non-volatile memory cells are each coupled to a second pair of bit lines.

8. The memory array of claim 1, wherein each of said volatile memory cells is coupled to a voltage supply rail coupled via a switch to a supply voltage level.

9. The memory array of claim 1, wherein said non-volatile memory cells each comprise a single resistive element coupled in series with a first transistor between a pair of bit lines.

10. The memory array of claim 1, wherein said non-volatile memory cells each comprise:
a first resistive element coupled in series with a first transistor between a first bit line and a first supply voltage; and
a second resistive element coupled in series with a second transistor between a second bit line and said first supply voltage.

11. The memory array of claim 1, wherein said at least one resistive element of each of said non-volatile memory cells is one of:
a spin transfer torque element with in-plane anisotropy;
a spin transfer torque element with perpendicular-to-plane anisotropy; and
a reduction oxide element.

12. A method of data back-up in the memory array of claim 1, the method comprising:
reading a first data bit stored by a first of said volatile memory cells; and
programming the resistive state of a first of said non-volatile memory cells associated with said first volatile memory cell based on said first data bit.

13. A method of restoring data in the memory array of claim 1, the method comprising:

reading from a second of said non-volatile memory cells a programmed resistive state representing a second data bit; and writing said second data bit to a second of said volatile memory cells associated with said second non-volatile memory cell.

* * * * *